(12) United States Patent
Wang

(10) Patent No.: US 10,886,884 B2
(45) Date of Patent: Jan. 5, 2021

(54) INDUCTIVELY COUPLED FILTER AND WIRELESS FIDELITY WIFI MODULE

(71) Applicant: HUAWEI TECHNOLOGIES CO., LTD., Guangdong (CN)

(72) Inventor: Huijuan Wang, Beijing (CN)

(73) Assignee: Huawei Technologies Co., Ltd., Shenzhen (CN)

(*) Notice: Subject to any disclaimer, the term of this patent is extended or adjusted under 35 U.S.C. 154(b) by 9 days.

(21) Appl. No.: 16/307,747

(22) PCT Filed: Jun. 6, 2016

(86) PCT No.: PCT/CN2016/084908
§ 371 (c)(1),
(2) Date: Dec. 6, 2018

(87) PCT Pub. No.: WO2017/210814
PCT Pub. Date: Dec. 14, 2017

(65) Prior Publication Data
US 2019/0260344 A1 Aug. 22, 2019

(51) Int. Cl.
*H03H 7/09* (2006.01)
*H03H 7/06* (2006.01)
(Continued)

(52) U.S. Cl.
CPC ........... *H03H 7/09* (2013.01); *H01F 17/0013* (2013.01); *H01L 25/0657* (2013.01);
(Continued)

(58) Field of Classification Search
CPC .. H03H 7/09; H03H 7/427; H03H 2001/0085; H01F 17/0013; H01F 2017/0026
(Continued)

(56) References Cited

U.S. PATENT DOCUMENTS

2004/0108933 A1 6/2004 Chen et al.
2004/0263309 A1* 12/2004 Ito .................. H01F 17/0013
336/200
(Continued)

FOREIGN PATENT DOCUMENTS

CN 101202151 A 6/2008
CN 201532825 U 7/2010
(Continued)

OTHER PUBLICATIONS

Lap Kun Yeung, and Ke-Li Wu, "A Compact Second-Order LTCC Bandpass Filter With Two Finite Transmission Zeros", IEEE Transactions on Microwave Theory and Techniques, vol. 51, No. 2, Feb. 2003. pp. 337-341.
(Continued)

*Primary Examiner* — Rakesh B Patel
(74) *Attorney, Agent, or Firm* — Fish & Richardson P.C.

(57) ABSTRACT

Embodiments of the present invention provide an inductively coupled filter and a WiFi module. The inductively coupled filter includes a first circuit, where the first circuit is disposed on a first substrate; and a second circuit, where the second circuit is disposed on a second substrate; and the first substrate and the second substrate are disposed opposite to each other, so that a coil inductor in the first circuit and a coil inductor in the second circuit form a mutual induction structure. In the inductively coupled filter in the embodiments of the present invention, the coil inductors are disposed on two substrates respectively. This can reduce an area occupied by the inductively coupled filter on each package substrate.

18 Claims, 4 Drawing Sheets

(51) Int. Cl.

| | | |
|---|---|---|
| *H01F 17/00* | (2006.01) | |
| *H01L 25/065* | (2006.01) | |
| *H01L 25/00* | (2006.01) | |
| *H01L 27/01* | (2006.01) | |
| *H01L 49/02* | (2006.01) | |
| *H03H 1/00* | (2006.01) | |
| *H03H 3/00* | (2006.01) | |

(52) U.S. Cl.
CPC ............ *H01L 25/50* (2013.01); *H01L 27/016* (2013.01); *H01L 28/10* (2013.01); *H03H 1/00* (2013.01); *H03H 3/00* (2013.01); *H03H 7/06* (2013.01); *H01L 2225/06513* (2013.01); *H03H 2001/0085* (2013.01)

(58) Field of Classification Search
USPC ........................................ 333/175, 181, 185
See application file for complete search history.

(56) References Cited

U.S. PATENT DOCUMENTS

| | | | |
|---|---|---|---|
| 2007/0296537 A1* | 12/2007 | Yoon ................... | H01F 17/0013 336/223 |
| 2008/0061420 A1 | 3/2008 | Degani et al. | |
| 2011/0133860 A1 | 6/2011 | Fukamachi et al. | |
| 2015/0042415 A1* | 2/2015 | Hurwitz ................. | H03H 3/00 333/185 |
| 2017/0070202 A1* | 3/2017 | Yang ....................... | H03H 7/09 |

FOREIGN PATENT DOCUMENTS

| | | |
|---|---|---|
| CN | 102119485 A | 7/2011 |
| CN | 103545582 A | 1/2014 |
| CN | 104682910 A | 6/2015 |
| JP | H046911 A | 1/1992 |
| JP | 2008072121 A | 3/2008 |
| TW | I287239 B | 9/2007 |

OTHER PUBLICATIONS

R. C. Frye, L. Kai, G. Badakere, and L. Yaojian, "A Hybrid Coupled-Resonator Bandpass Filter Topology Implemented on Lossy Semiconductor Substrates," in Microwave Symposium, 2007. IEEE/MTT-S International, 2007, pp. 1757-1760.

International Search Report and Written Opinion issued in International Application No. PCT/CN2016/084908 dated Mar. 10, 2017, 17 pages.

Office Action issued in Japanese Application No. 2019-516035 dated Dec. 10, 2019, 8 pages (with English translation).

Ruiping Guo, "Circuit Analysis Basics," dated Oct. 1, 2010, total 2 pages (with English abstract).

Yisun Shen, "Transistor Radio Repair and Commissioning," dated May 1976, total 6 pages (with English translation).

Office Action issued in Chinese Application No. 201680032826.3 dated Sep. 29, 2020, 14 pages (with English translation).

* cited by examiner

INDUCTIVELY COUPLED FILTER AND WIRELESS FIDELITY WIFI MODULE

CROSS-REFERENCE TO RELATED APPLICATIONS

This application is a National Stage of International Application No. PCT/CN2016/084908, filed on Jun. 6, 2016, which is hereby incorporated by reference in its entirety.

TECHNICAL FIELD

The present invention relates to the field of filter technologies, and more specifically, to an inductively coupled filter and a WiFi module.

BACKGROUND

With development of a system packaging technology, a passive device such as a resistor, a capacitor, or an inductor can be fabricated on a silicon-based surface, a glass-based surface, or another surface by using a semiconductor process and a thin film deposition technology. With the semiconductor process and a thin film deposition technology, a thin enough (a minimum line width: 0.1 um to 0.3 um) line and a pattern with small enough line spacing can be formed. After the passive devices are connected, a high frequency LC filter can be implemented on the silicon-based or glass-based surface. A typical application is an inductively coupled filter. A feature of the inductively coupled filter is that a mutual inductance value can be adjusted to adjust a pole position of the filter, to obtain a relatively good suppression effect. An inductively coupled filter usually includes at least two adjacent coil inductors. Performance of the filter is adjusted based on mutual inductance generated between the coil inductors. In a prior-art inductively coupled filter, coil inductors are disposed adjacently on a same package substrate surface, and required mutual inductance is obtained by adjusting inductance values of the coil inductors, distances between the coil inductors, or the like. However, a relatively large area is occupied when all the coil inductors are disposed on one package substrate surface. This does not meet filter miniaturization and low-cost requirements.

SUMMARY

This application provides an inductively coupled filter and a WiFi module, to reduce an area occupied by coil inductors on each package substrate.

According to a first aspect, an inductively coupled filter is provided, including a first circuit, where the first circuit is disposed on a first substrate; and a second circuit, where the second circuit is disposed on a second substrate; and the first substrate and the second substrate are disposed opposite to each other, so that a coil inductor in the first circuit and a coil inductor in the second circuit form an instrument transformer.

In the prior art, inductors in an inductively coupled filter are all located on a same package substrate surface. A relatively large area is inevitably occupied when the plurality of inductors are disposed on the same package substrate surface. Compared with disposing all the coil inductors on the same substrate surface in the prior art, disposing the coil inductors on two substrates respectively in this application can reduce an area occupied by the inductively coupled filter on each package substrate.

With reference to the first aspect, in a first implementation of the first aspect, the inductively coupled filter further includes a metal connection structure that connects the first substrate and the second substrate.

With reference to the first implementation of the first aspect, in a second implementation of the first aspect, the metal connection structure includes a line that connects the first circuit and the second circuit.

With reference to any one of the first aspect, or the first and the second implementations of the first aspect, in a third implementation of the first aspect, both the coil inductor in the first circuit and the coil inductor in the second circuit include at least two layers of metal.

With reference to any one of the first aspect, or the first to the third implementations of the first aspect, in a fourth implementation of the first aspect, the first substrate and/or the second substrate are/is made of at least one of a silicon material, a glass material, or a ceramic material.

With reference to any one of the first aspect, or the first to the fourth implementations of the first aspect, in a fifth implementation of the first aspect, the coil inductor in the first circuit and/or the coil inductor in the second circuit are/is in a rectangular, circular, or polygonal shape.

With reference to any one of the first aspect, or the first to the fourth implementations of the first aspect, in a sixth implementation of the first aspect, the first circuit and/or the second circuit further include/includes a capacitor and a resistor.

With reference to any one of the first aspect, or the first to the sixth implementations of the first aspect, in a seventh implementation of the first aspect, the first substrate and/or the second substrate are/is integrated passive device IPD substrates/an integrated passive device IPD substrate.

According to a second aspect, a WiFi module is provided, where the WiFi module includes the inductively coupled filter in the first aspect.

In some of the foregoing implementations, the inductively coupled filter is applied to an RF module. The RF module may be a WiFi module.

In some of the foregoing implementations, the metal connection structure is a metal bump connection structure, and the metal bump connection structure is a solder bump or electroplating solder.

In some of the foregoing implementations, the metal connection structure is a metal bump connection structure, the metal bump connection structure has a function of supporting and connecting the first substrate and the second substrate, and a partial structure of the metal bump connection structure is configured to connect the first circuit and the second circuit.

In some of the foregoing implementations, a distance between the first substrate and the second substrate is adjustable. A mutual inductance value of the inductively coupled filter can be adjusted by adjusting the distance between the first substrate and the second substrate.

BRIEF DESCRIPTION OF DRAWINGS

To describe the technical solutions in the embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
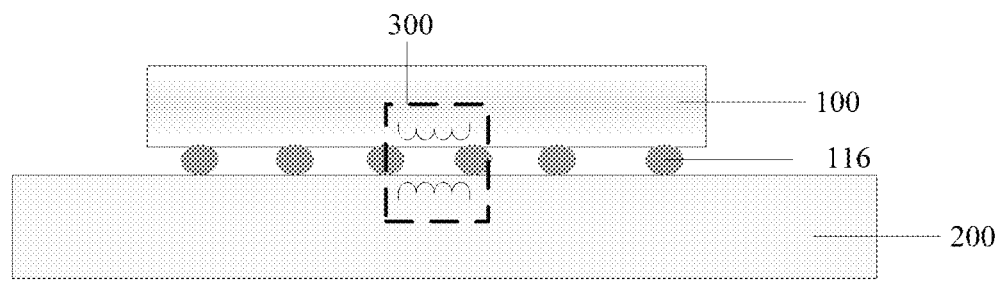
FIG. 1 is a schematic structural diagram of an inductively coupled filter according to an embodiment of the present invention.

With development of a system packaging technology, much attention is paid to a passive integration technology implemented on a silicon-based or glass-based surface by using a semiconductor process. A passive module such as an inductor, a capacitor, or a resistor can be fabricated on a silicon chip or a glass wafer by using the passive integration technology. Specifically, a wafer level semiconductor process may be used on the silicon chip, to implement interconnection between thin lines. However, because of semi-conductivity of a silicon base and a limitation of a metal laminate on a surface of the silicon base, a Q factor of a spiral inductor fabricated on the silicon base by using a traditional method is limited. Even if high-impedance silicon is used and a thickness of coil metal exceeds 10 um, it is quite difficult for the Q factor to be greater than 50. Currently, steps of implementing an inductively coupled filter on the silicon base are as follows:

S101: Determine a corresponding lumped circuit according to a design indicator, where the indicator includes a center frequency, a bandwidth, a passband insertion loss, an out-of-band attenuation of the filter, or the like.

S102: Select an appropriate LC filter transfer function, for example, a Chebyshev filter or a Butterworth filter.

S103: Select an appropriate order for the filter according to a suppression requirement.

S104: Determine specific parameters of components in the filter according to the indicator such as the center frequency or the bandwidth of the filter.

S105: On a silicon-based surface, properly design a layout of a passive inductor and a capacitor that are required, implement an electrical connection, and finally fabricate a structure by using a series of semiconductor processes such as thin film deposition, metal sputtering, electroplating, photoetching, and etching.

An inductively coupled filter in the prior art is usually fabricated on a same silicon substrate. Passive devices such as a resistor, a capacitor, and a coil inductor in the filter are located on the same silicon substrate, and the filter includes at least two coil inductors. A mutual inductance value can be adjusted by adjusting a distance between the at least two coil inductors and an L value of each inductor. Sometimes, to obtain relatively large mutual inductance, a coil inductor having a relatively large inductance value needs to be used. However, the coil inductor having a relatively large inductance value occupies a relatively large area on the silicon-based surface. This does not meet filter miniaturization and low-cost requirements. In view of this, an embodiment of the present invention provides an inductively coupled filter. The inductively coupled filter includes a first circuit and a second circuit located on a first substrate and a second substrate, respectively. The first substrate and the second substrate are disposed opposite to each other, so that a coil inductor in the first circuit and a coil inductor in the second circuit form an instrument transformer. The coil inductors are disposed on different substrates to reduce an area occupied on each substrate. The following describes in detail the inductive filter in this embodiment of the present invention with reference to FIG. 1 to FIG. 7.

FIG. 1 is a schematic structural diagram of the inductively coupled filter according to this embodiment of the present invention. The inductively coupled filter includes a first circuit disposed on a first substrate (100) and a second circuit disposed on a second substrate (200). Both the first circuit and the second circuit include a coil inductor. The first substrate and the second substrate are disposed opposite to each other, so that a coil in the first circuit and a coil in the second circuit form a mutual induction structure 300. Specifically, the first circuit may include a first coil inductor, and the second circuit includes a second coil inductor. The first coil inductor and the second coil inductor are disposed opposite to each other, to generate mutual inductance. It should be understood that, inductance values of the first coil inductor and the second coil inductor, a distance between the first coil inductor and the second coil inductor, and a relative position between the first coil inductor and the second coil inductor can all be adjusted according to a requirement of the inductively coupled filter. In this way, the mutual inductance can be adjusted to flexibly adjust a transmission zero of the inductively coupled filter.

Figure 2:
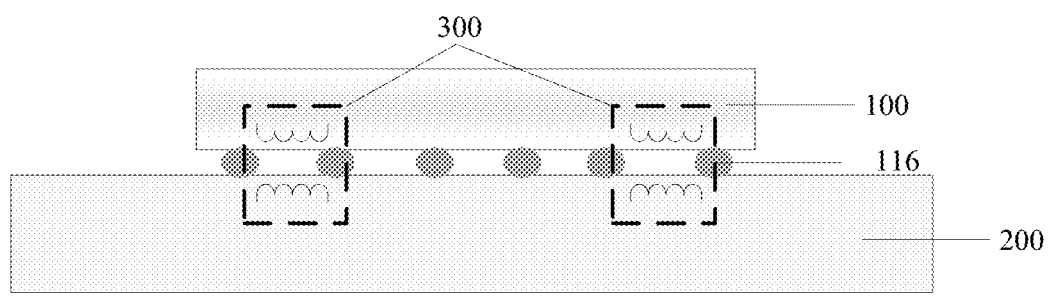
FIG. 2 is a schematic structural diagram of an inductively coupled filter according to an embodiment of the present invention.

In addition, both the first circuit and the second circuit may include two or more coil inductors. In this case, a plurality of coil inductors in the first circuit and a plurality of coils in the second circuit may form a plurality of instrument transformers, or a plurality of coil inductors in the first circuit and a plurality of coil inductors in the second circuit form one instrument transformer. In the inductively coupled filter in this embodiment of the present invention, a quantity of coil inductors and a quantity of instrument transformers are not limited. As shown in FIG. 2, the first circuit on the first substrate 100 includes two coil inductors, the second circuit on the second substrate 200 also includes two coil inductors, and the coil inductors on the first circuit and the coil inductors on the second circuit form two mutual induction structures 300.

It should be understood that, the first circuit may further include another component of the inductively coupled filter, for example, a resistor or a capacitor, or may include only the coil inductors, and other components in the coupled filter are all distributed in the second circuit. Similarly, the second circuit may further include another component of the inductively coupled filter, for example, a resistor or a capacitor, or may include only the coil inductors, and other components in the coupled filter are all distributed in the first circuit.

As shown in FIG. 1 and FIG. 2, the inductively coupled filter further includes a metal connection structure 116 that connects the first substrate and the second substrate. The metal connection structure 116 is configured to connect the first substrate and the second substrate. Optionally, the metal connection structure 116 may further connect the first circuit and the second circuit. A part of the metal connection structure may be configured to connect the first circuit and the second circuit. In this case, the metal connection structure is equivalent to a line that connects the first circuit and the second circuit, that is, the metal connection structure includes the line that connects the first circuit and the second circuit. Optionally, the metal connection structure may be specifically a metal via, a solder bump, electroplating solder, or the like.

The first substrate or the second substrate may be made of at least one of a silicon material, a glass material, or a ceramic material. The coil inductor in the first circuit or the second circuit may be a planar spiral inductor.

Compared with disposing all coil inductors on a same substrate surface in the prior art, disposing the coil inductors on two substrates respectively in this embodiment of the present invention can reduce an area occupied by the inductively coupled filter on each substrate.

Optionally, in an embodiment, the inductively coupled filter in this embodiment of the present invention may be a second- or higher-order filter. It should be understood that, when the inductively coupled filter in this embodiment of the present invention is a second-order filter, both the first circuit and the second circuit include a coil inductor, and the two coil inductors form an instrument transformer; or when the inductively coupled filter in this embodiment of the present invention is a higher-than-second-order filter, both the first circuit and the second circuit include a plurality of coil inductors, and the plurality of coil inductors in the first circuit and the plurality of coil inductors in the second circuit form a plurality of instrument transformers.

Optionally, in an embodiment, the first substrate or the second substrate may alternatively be a compound substrate.

Optionally, in an embodiment, the coil inductor in the first circuit and/or the coil inductor in the second circuit include/includes two layers of metal.

Optionally, in an embodiment, the coil inductor in the first circuit and/or the coil inductor in the second circuit are/is in a rectangular, circular, or polygonal shape.

Optionally, in an embodiment, the first circuit and/or the second circuit further include/includes a capacitor and a resistor.

Optionally, in an embodiment, the first substrate and/or the second substrate are/is integrated passive device (Integrated Passive Devices, IPD) substrates/an integrated passive device (Integrated Passive Devices, IPD) substrate. It should be understood that, because the IPD substrate is relatively thin, when both the first substrate and the second substrate are IPD substrates, a volume change brought after the first substrate and the second substrate are stacked one on top of another is relatively small, and may usually be ignored.

Optionally, the mutual induction structure of the inductively coupled filter in this embodiment of the present invention may be used for miniaturized integration of various types of RF modules, for example, a Wireless Fidelity (Wireless Fidelity, WiFi) module.

It should be understood that, the inductively coupled filter in this embodiment of the present invention may be fabricated by using an IPD technology; that is, a capacitor, an inductor, and a resistor may be fabricated on a substrate such as a silicon base by using a semiconductor process and technology, and after these devices are connected, the inductively coupled filter can be fabricated. The integrated passive device (Integrated Passive Devices, IPD) technology can be used to integrate a plurality of electronic functions, for example, a sensor, an RF transceiver, a micro-electro-mechanical system, a power amplifier, a power supply management unit, and a digital processor, so as to provide a compact IPD product. The IPD technology can be used to minimize a product and improve system performance. Therefore, the integrated passive device technology can play a large part in reducing a size and a weight of a product, and in increasing a function without changing a volume of the existing product. Specifically, a passive module, which includes a filter, fabricated on the silicon base by using the IPD technology has advantages such as high reliability, compact structure, and low cost. The IPD technology can be well applied to a radio frequency communications system, and to a great extent, can be used in place of a traditional low temperature co-fired ceramic (Low Temperature Co-fired Ceramic, LTCC) technology to fabricate a filter. The IPD technology is relatively suitable for being used to fabricate a high-frequency filter, and specifically, may be used to fabricate a high-frequency filter in a WiFi module.

In a process of fabricating a passive module including the inductively coupled filter in this embodiment of the present invention by using the IPD technology, a limited area of space can be utilized, so that two coil inductors or a plurality of coil inductors on two different structures (for example, the first substrate and the second substrate) form an upper- and lower-layer coupled structure, and relatively strong cross coupling is obtained.

Figure 3:
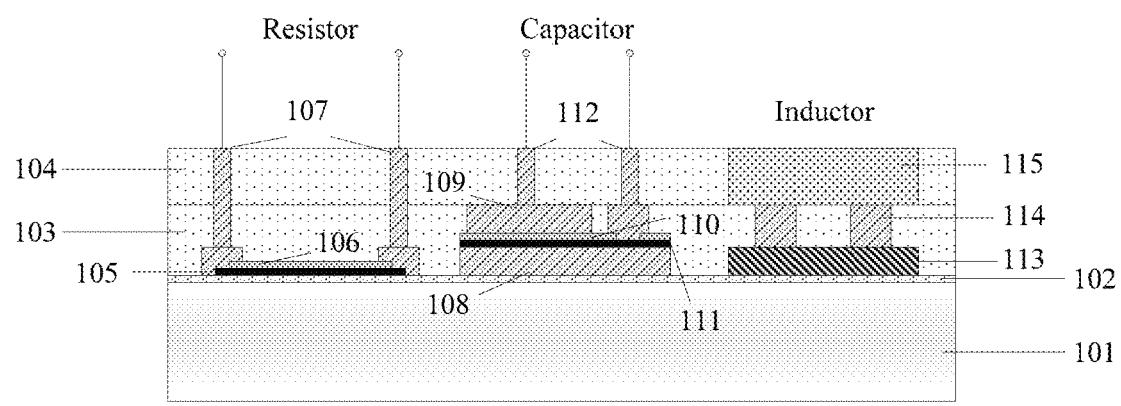
FIG. 3 is a schematic cross-sectional structural diagram of a resistor, a capacitor, and a coil inductor fabricated on a silicon base.

A cross-sectional structure of the resistor, the capacitor, or the coil inductor of the inductively coupled filter in this embodiment of the present invention may be shown in FIG. 3. Meanings of reference signs in the figure are as follows: 101 represents a high-impedance silicon material substrate, 102 represents a silicon dioxide layer, 103 represents a first insulation medium and passivation layer, 104 represents a second insulation medium and passivation layer, 105 represents a resistive material, 106 represents silicon nitride, 107 represents a leading electrode of the resistor, 108 represents a lower plate of a capacitor structure, 109 represents an upper plate of the capacitor structure, 110 represents a medium layer of the capacitor, 111 represents a tantalum silicide (TaSi) layer on the lower plate of the capacitor, 112 represents a leading layer of the capacitor, 113 represents a metal layer of a first inductor, 114 represents an inductor metal via, and 115 represents a metal layer of a second inductor. The resistive material may be TaSi.

An embodiment of the present invention further provides a WiFi module. The WiFi module includes the foregoing inductively coupled filter. Operating frequencies of the WiFi module may further be 2.4-2.5 GHz and 5.0 GHz.

Figure 4:
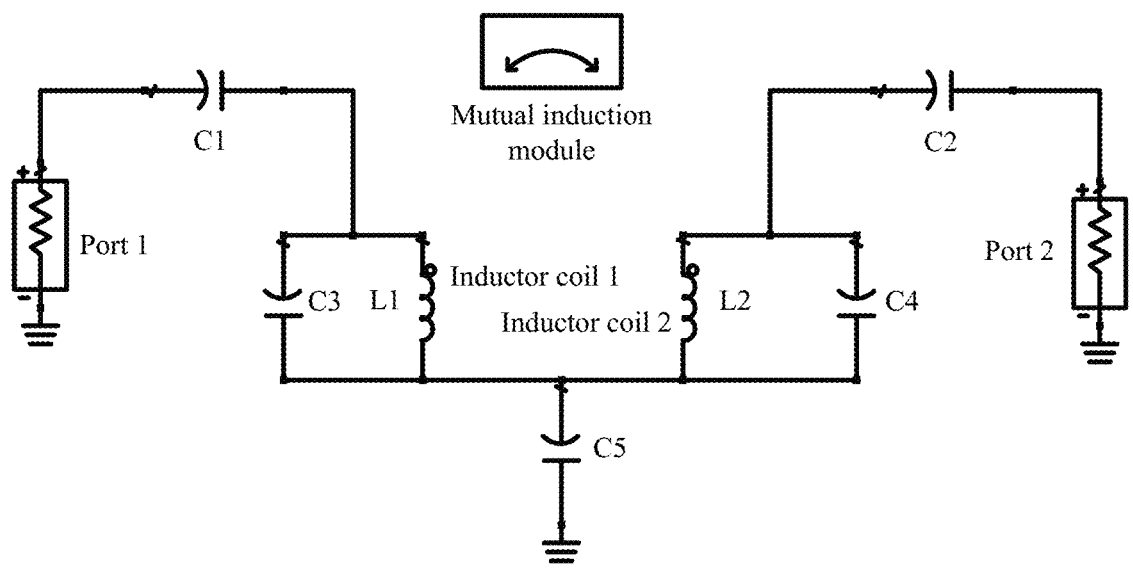
FIG. 4 is a schematic diagram of a lumped circuit of an inductively coupled filter according to an embodiment of the present invention.
Figure 5:
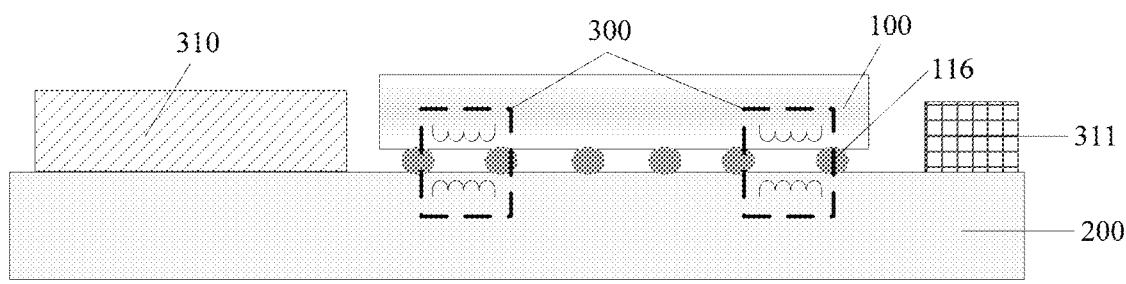
FIG. 5 is a schematic structural diagram of a WiFi module according to an embodiment of the present invention.
Figure 6:
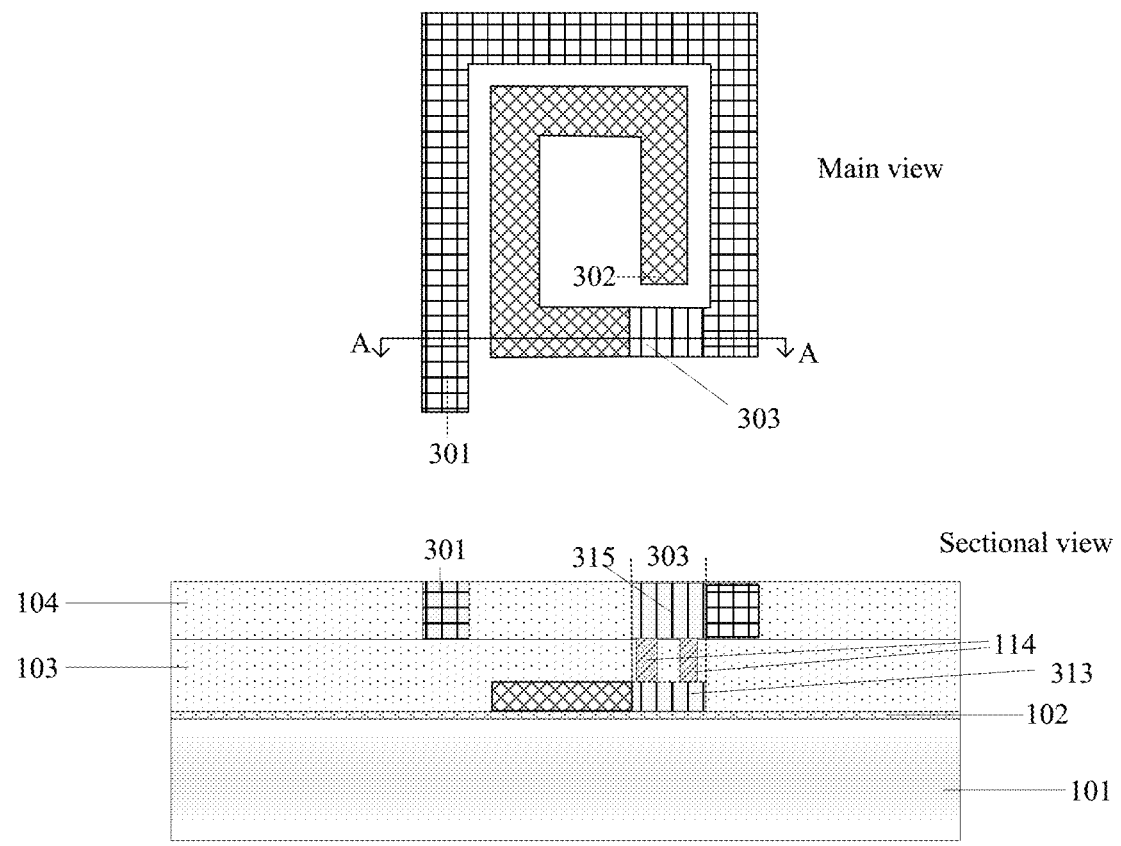
FIG. 6 is a schematic structural diagram of a coil inductor in an inductively coupled filter according to an embodiment of the present invention.
Figure 7:
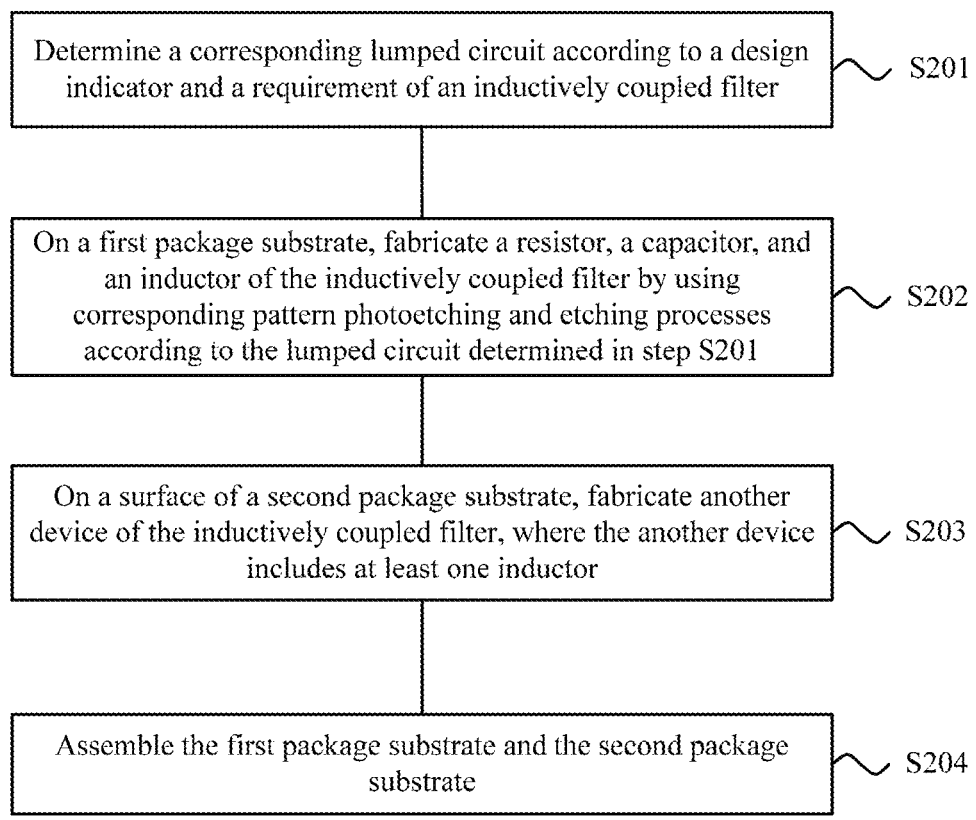
FIG. 7 is a schematic flowchart for fabricating an inductively coupled filter according to an embodiment of the present invention.

With reference to FIG. 4 to FIG. 6, the following describes in detail the WiFi module in this embodiment of the present invention by using a WiFi module packaged on a package substrate as an example.

A design indicator of a band-pass filter on WiFi is used as an example. A range of passband is 2400-2500 MHz. FIG. 4 shows a typical lumped circuit of a filter formed by using a coupled structure. A coil inductor 1 and a coil inductor 2 in FIG. 4 are equivalent to a first coil inductor and a second coil inductor of the inductively coupled filter in this embodiment of the present invention, respectively. Because mutual inductance exists between the coil inductor 1 and the coil inductor 2, a frequency and a filtering feature of the filter can be optimized by controlling a value of the mutual inductance between the two coil inductors.

Components are fabricated on a package substrate made of a high-impedance silicon material according to the lumped circuit in FIG. 4, and a schematic structural diagram of the WiFi module in this embodiment of the present invention shown in FIG. 5 is obtained. In FIG. 5, 100 represents a first substrate with a coil inductor, 200 represents a second substrate with a coil inductor, the coil inductors on 100 and 200 form a mutual induction structure 300, 100 and 200 are connected by using a metal connection structure 116, and the metal connection structure 116 can connect devices on the first package substrate and the second package substrate, such as a capacitor and an inductor. 310 represents another active device included in the WiFi module, and 311 represents another passive device included in the WiFi module.

FIG. 6 is a schematic structural diagram of a coil inductor in the inductively coupled filter according to this embodiment of the present invention. The coil inductor in FIG. 6 is a coil inductor of the inductively coupled filter, and may be disposed on the substrate 100 or 200 shown in FIG. 5. FIG. 6 includes a main view and a sectional view of the coil inductor. The coil inductor includes two layers of metal. In the main view, 301 represents an input port of the inductor, 302 represents an output port of the inductor, 303 represents a structure connecting an upper metal layer and a lower metal layer of the inductor, a coil from 301 to 303 is located at the upper layer, and a coil from 303 to 302 is located at the lower layer.

In the sectional view of FIG. 6, 303 specifically includes an upper-layer metal part 315, a lower-layer metal part 313, and a metal via 114 between 313 and 315. In addition, a substrate on which the coil inductor resides further includes the high-impedance silicon material substrate 101, the silicon dioxide layer 102, the first insulation medium and passivation layer 103, and the second insulation medium and passivation layer 104.

In the coil inductor shown in FIG. 6, the coil from 301 to 303 is connected to 315, the coil from 303 to 302 is connected to 313, and 313 and 315 are connected by using 114. In this way, the upper- and lower-layer coils of the coil inductor can be connected by using 303. It should be understood that 313, 114, and 315 in 303 are all located on a same substrate, but 116 in FIG. 1 and FIG. 2 is located between two substrates, and is used to connect the two substrates.

The foregoing describes the inductively coupled filter in this embodiment of the present invention with reference to FIG. 1 to FIG. 6. The following briefly describes, with reference to FIG. 7, a process of fabricating the inductively coupled filter in this embodiment of the present invention. The process of fabricating the inductively coupled filter in this embodiment of the present invention is as follows.

S201: Determine a corresponding lumped circuit according to a design indicator and a requirement of the inductively coupled filter.

The design indicator may include a center frequency, a bandwidth, a passband insertion loss, an out-of-band attenuation of the filer, or the like.

S202: On a first package substrate, fabricate part of a resistor, a capacitor, and an inductor of the inductively coupled filter by using corresponding pattern photoetching and etching processes according to the lumped circuit determined in step S201.

A cross-sectional structure of the resistor, the capacitor, and the inductor obtained in step 202 may be the structure shown in FIG. 3.

S203: On a surface of a second package substrate, fabricate another device of the inductively coupled filter, where the another device on the second package substrate includes at least one inductor. For a cross-sectional structure of the second substrate obtained in step 203, refer to the structure shown in FIG. 3.

S204: Assemble the first package substrate and the second package substrate, with coil inductors on the two package substrates being disposed opposite to each other, to ensure that the coil inductors are cross-coupled properly, thereby implementing a controllable transmission zero.

After steps S201 to S204 are performed, the inductively coupled filter in this embodiment of the present invention can be obtained. It should be understood that, after step S204, another chip and surface-mount device of the WiFi module are surface-mounted on one side or double sides of the package substrates, and glue is coated on the another chip and surface-mount device for protection. Then the WiFi module in this embodiment of the present invention can be obtained.

The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that sequence numbers of the foregoing processes do not mean execution sequences in various embodiments of the present invention. The execution sequences of the processes should be determined according to functions and internal logic of the processes, and should not be construed as any limitation on the implementation processes of the embodiments of the present invention.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. An inductively coupled filter, comprising:
   a first circuit, wherein the first circuit includes a coil inductor and is disposed on a first substrate; and
   a second circuit, wherein the second circuit includes a coil inductor and is disposed on a second substrate; and
   a metal connection structure that connects respective surfaces of the first substrate and the second substrate to one another, wherein the surface of the first substrate faces the surface of the second substrate, wherein the first substrate and the second substrate are disposed opposite to each other such that the first and second circuits are disposed between the first and second substrates, wherein the coil inductor in the first circuit and the coil inductor in the second circuit form a mutual induction structure.

2. The inductively coupled filter according to claim 1, wherein part of the metal connection structure connects respective surfaces of the first and second circuits to one another, the surface of the first circuit facing the surface of the second circuit.

3. The inductively coupled filter according to claim 1, wherein the metal connection structure comprises a line that connects the first circuit and the second circuit.

4. The inductively coupled filter according to claim 1, wherein both the coil inductor in the first circuit and the coil inductor in the second circuit comprise at least two layers of metal.

5. The inductively coupled filter according to claim 1, wherein at least one of the following:
the first substrate is made of at least one of a silicon material, a glass material, or a ceramic material; or
the second substrate is made of at least one of a silicon material, a glass material, or a ceramic material.

6. The inductively coupled filter according to claim 1, wherein at least one of the following:
the coil inductor in the first circuit is in a rectangular, circular, or polygonal shape; or
the coil inductor in the second circuit is in a rectangular, circular, or polygonal shape.

7. The inductively coupled filter according claim 1, wherein:
the first circuit further comprises a capacitor and a resistor; or
the second circuit further comprises a capacitor and a resistor.

8. The inductively coupled filter according to claim 1, wherein:
the first substrate is an integrated passive device (IPD) substrate; or
the second substrate is an integrated passive device (IPD) substrate.

9. The inductively coupled filter according to claim 1, wherein the metal connection structure includes at least one metal via.

10. The inductively coupled filter according to claim 1, wherein the metal connection structure includes at least one solder bump.

11. The inductively coupled filter according to claim 1, wherein the metal connection structure includes electroplating solder.

12. A Wireless Fidelity (WiFi) module, comprising an inductively coupled filter, wherein the inductively coupled filter comprises:
a first circuit, wherein the first circuit includes a coil inductor and is disposed on a first substrate; and
a second circuit, wherein the second circuit includes a coil inductor and is disposed on a second substrate; and
a metal connection structure that connects respective surfaces of the first substrate and the second substrate to one another, wherein the surface of the first substrate faces the surface of the second substrate,
wherein the first substrate and the second substrate are disposed opposite to each other such that the first and second circuits are disposed between the first and second substrates, and
wherein the coil inductor in the first circuit and the coil inductor in the second circuit form a mutual induction structure.

13. The WiFi module according to claim 12, wherein at least one of the following:
the first substrate is made of at least one of a silicon material, a glass material, or a ceramic material; or
the second substrate is made of at least one of a silicon material, a glass material, or a ceramic material.

14. The WiFi module according to claim 12, wherein at least one of the following:
the coil inductor in the first circuit is in a rectangular, circular, or polygonal shape; or
the coil inductor in the second circuit is in a rectangular, circular, or polygonal shape.

15. The WiFi module according to claim 12, wherein at least one of the following:
the first circuit comprises a capacitor and a resistor; or
the second circuit comprises a capacitor and a resistor.

16. The WiFi module according to claim 12, wherein at least one of the following:
the first substrate is an integrated passive device (IPD) substrate; or
the second substrate is an integrated passive device (IPD) substrate.

17. The WiFi module according to claim 12, wherein the metal connection structure comprises a line that connects the first circuit and the second circuit.

18. The WiFi module according to claim 12, wherein both the coil inductor in the first circuit and the coil inductor in the second circuit comprise at least two layers of metal.

* * * * *